United States Patent
Yu et al.

(10) Patent No.: US 10,777,718 B2
(45) Date of Patent: Sep. 15, 2020

(54) DISPLAY DEVICE AND METHOD FOR PACKAGING SAME

(71) Applicant: INNO-PACH TECHNOLOGY PTE LTD, Singapore (SG)

(72) Inventors: Deze Yu, Singapore (SG); Wanning Zhang, Singapore (SG)

(73) Assignee: INNO-PACH TECHNOLOGY PTE LTD., Singapore (SG)

( * ) Notice: Subject to any disclaimer, the term of this patent is extended or adjusted under 35 U.S.C. 154(b) by 0 days.

(21) Appl. No.: 16/353,402

(22) Filed: Mar. 14, 2019

(65) Prior Publication Data
US 2020/0119243 A1  Apr. 16, 2020

(30) Foreign Application Priority Data
Oct. 12, 2018 (CN) .......................... 2018 1 1191210

(51) Int. Cl.
| | |
|---|---|
| *G09G 3/32* | (2016.01) |
| *H01L 33/62* | (2010.01) |
| *H01L 27/15* | (2006.01) |
| *H01L 33/30* | (2010.01) |
| *H01L 33/44* | (2010.01) |

(52) U.S. Cl.
CPC ............... *H01L 33/62* (2013.01); *G09G 3/32* (2013.01); *H01L 27/156* (2013.01); *H01L 33/30* (2013.01); *H01L 33/44* (2013.01); *G09G 2300/0426* (2013.01); *H01L 2933/0033* (2013.01)

(58) Field of Classification Search
CPC .......... G09G 3/32; H01L 27/156; H01L 33/62
See application file for complete search history.

(56) References Cited

U.S. PATENT DOCUMENTS

| | | | | |
|---|---|---|---|---|
| 8,824,125 B1* | 9/2014 | Cox | ............... | G09F 9/33 361/622 |
| 2018/0337142 A1* | 11/2018 | Cheng | ............... | H01L 23/5389 |
| 2019/0384091 A1* | 12/2019 | Li | ............... | H05K 1/18 |

* cited by examiner

*Primary Examiner* — Thomas L Dickey
(74) *Attorney, Agent, or Firm* — Muncy, Geissler, Olds & Lowe, P.C.

(57) ABSTRACT

A display device and a method for packaging the display device are disclosed. The display device includes an optical module including multiple light-emitting units disposed apart from one another and a first plastic layer. Each light-emitting unit includes at least three LEDs, and the first plastic layer fills the gaps between the light-emitting units. The display device further includes a driver IC including a second plastic layer, driving chips, through-holes, a first structure and a second structure. The second plastic layer fills the gaps between the driving chips, and the second plastic layer has a third layer. The through-holes penetrate through the second plastic layer along a thickness direction of the through-holes and are filled with a conductive material. The first structure is electrically connected to the driving chips and to the conductive material in the through-holes. The second structure is electrically connected to the conductive material in the through-holes.

13 Claims, 1 Drawing Sheet

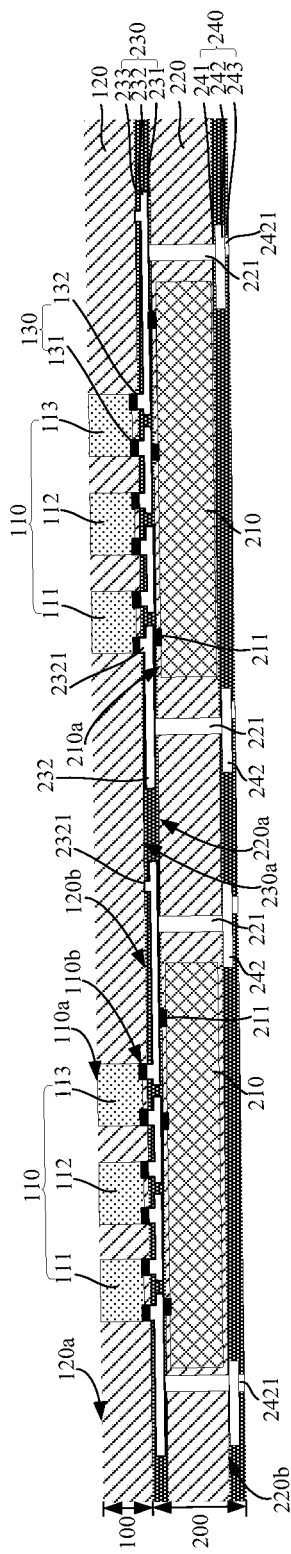

DISPLAY DEVICE AND METHOD FOR PACKAGING SAME

CROSS-REFERENCE TO RELATED APPLICATION

This application claims the priority of Chinese patent application number 201811191210.8, filed on Oct. 12, 2018, the entire contents of which are incorporated herein by reference.

TECHNICAL FIELD

The present invention relates to the field of display technology and, in particular, to a display device and a method for packaging it.

BACKGROUND

Display devices, which convert acquired or stored information into visual information and display the visual information, have been widely used in various applications such as homes or commercial facilities.

A display device may be a monitor connected to a personal computer (PC) or a server computer, a portable computer device, a navigation device, a conventional television (TV), an internet protocol television (IPTV), a smart phone, a tablet PC, a personal digital assistant (PAD), a portable terminal such as a cellular phone, any one of various display devices for reproducing an advertisement or a movie, or an audio/video system of any type. Display devices can display still or moving images to the users in many display forms.

However, some commonly-used conventional display devices, such as liquid crystal displays (LCDs) which include an LCD module and a backlight module, require a stringent selection of lamps or LEDs used in the backlight module so as to achieve a desired brightness and a color temperature. Additionally, the LCD module is further required to be capable of color temperature control and even have a special design to this end. This imposes demanding requirements on the whole structure and leads to a large footprint. Some other commonly-used conventional display devices, such as an organic light-emitting diode (OLED) display devices which include a display module but not any backlight module, are not based on a mature technology and thus associated with various issues such as a lower transmittance or a short service lifetime. Moreover, when light-emitting units are driven by driving chips, the driving chip is incapable of individually controlling light-emitting units.

SUMMARY OF THE INVENTION

It is an object of the present invention to provide a display device and a method for packaging such a display device so as to allowing space savings and electrical adjustments in terms of LED brightness and color temperature.

To this end, in one aspect, the present invention provides a display device comprising: an optical module comprising a plurality of light-emitting units disposed apart from one another and a first plastic layer, each of the light-emitting units comprising at least three light-emitting diodes LEDs with different colors, the LEDs disposed apart from one another, each of the LEDs comprising a light-emitting layer and a first soldering layer, the first soldering layer provided with solder pads, the first plastic layer filling gaps between the plurality of light-emitting units and between the LEDs such that the LEDs and the light-emitting units fixed and electrically isolated, the first plastic layer comprising a first layer and a second layer opposing the first layer, the first soldering layers and the second layer located on a same side of the optical module, the solder pads provided on the first soldering layers exposed at the second layer; and a driver IC comprising a plurality of driving chips, a second plastic layer, a plurality of through-holes, a first structure and a second structure, each of the driving chips comprising a second soldering layer and a backside opposing the second soldering layer, the second soldering layer provided with solder pads, the driving chips disposed apart from one another, the second plastic layer filling gaps between the plurality of driving chips such that the driving chips are fixed together while electrically isolated, the second plastic layer comprising a third layer and a fourth layer opposing the third layer, the second soldering layers and the third layer located on a same side of the driver IC, the plurality of through-holes penetrating through the second plastic layer along a thickness direction of the second plastic layer, the first structure located on the third layer, the first structure electrically connected to the driving chips via the solder pads on the second soldering layers, the first structure electrically connected to the conductive material in the through-holes, the second structure arranged on the fourth layer, the second structure electrically connected to the conductive material in the through-holes, wherein the optical module is bonded to the driver IC, with the second layer facing toward the third layer, such that each bonded driving chip is able to independently control turn on/off of the LEDs in at least one of the light-emitting units and independently electrically adjust their brightness and color temperatures of the LEDs in at least one of the light-emitting units.

Optionally, the first structure may comprise a first passivation layer, a first metal layer and a second passivation layer, the first metal layer comprising a plurality of first welding pads, the first passivation layer covering the third layer and the second soldering layers, the first metal layer located on a partial area of the first passivation layer, the second passivation layer covering the first passivation layer and the first metal layer, the first and second passivation layers configured to electrically isolate the first metal layer to prevent a short circuit in the first metal layer, the plurality of first welding pads exposed at the second passivation layer.

Optionally, a layer of the second passivation layer opposing the third layer and the fourth layer may constitute, together with the exposed plurality of first welding pads, a bonding layer of the driver IC.

Optionally, first and second connecting holes may be provided in the first passivation layer, the first and second connecting holes filled with a conductive material, the conductive material filled in the first and second connecting holes having a first end electrically connected to the first metal layer and a second end electrically connected the conductive material in the through-holes and to the solder pads arranged on the second soldering layers, thereby an electrical connection of the driver IC on the third layer is achieved.

Optionally, the second structure may comprise a third passivation layer, a second metal layer and a fourth passivation layer, the second metal layer comprising a plurality of second welding pads, the third passivation layer covering the fourth layer, the second metal layer located on a partial area of the third passivation layer, the fourth passivation layer covering the third passivation layer and the second metal layer, the third and fourth passivation layers configured to electrically isolate the second metal layer to prevent a circuit in the second metal layer, the plurality of second welding pads exposed at the fourth passivation layer.

Further, the third passivation layer is provided with third connecting holes, the third connecting holes filled with a conductive material, the conductive material filled in the third connecting holes having a first end electrically connected to the second metal layer and a second end electrically connected to the conductive material filled in the through-holes, thereby circuits on the third layer of the driver IC are electrically connected to circuits on the fourth layer of the driver IC.

Optionally, the solder pads on the first soldering layers may be electrically connected to the first welding pads exposed at the bonding layer of the driver IC by bonding.

Optionally, each of the light-emitting units may comprise three LEDs, the three LEDs sequentially having colors of red, green and blue.

Optionally, the LEDs may include gallium arsenide LEDs.

Optionally, each of the LEDs is provided with an anode solder pad and a cathode solder pad on the first soldering layer.

Optionally, the display device may have a thickness smaller than or equal to 0.5 mm.

Optionally, each pixel corresponding to a light-emitting unit is configured for red, green and blue light emissions.

Optionally, the driver IC is configured to control 4-8 pixels.

In another aspect, the present invention provides a method for packaging a display device, comprising the steps of: providing a first support plate and a second support plate, the first support plate provided with a first adhesive layer on one layer of the first support plate, the second support plate provided with a second adhesive layer on one layer of second support plate;

placing at least one optical module to be packaged onto the first adhesive layer at an interval, the optical module comprising a plurality of light-emitting units disposed apart from one another, wherein each of the light-emitting units comprises at least three light-emitting diodes LEDs with different colors, the at least three LEDs disposed apart from one another, each of the LEDs comprising a light-emitting layer and a first soldering layer, the first soldering layer provided with solder pads, the first soldering layer facing toward the first adhesive layer, wherein the LEDs in the plurality of light-emitting units have a same arrangement order and direction, and wherein the at least one optical module to be packaged is oriented in a same direction;

placing at least one driver IC to be packaged onto the second adhesive layer at an interval, the driver IC comprising a plurality of driving chips, each of the driving chips comprising a second soldering layer and a backside opposing the second soldering layer, the second soldering layer provided with solder pads, the driving chips disposed apart from one another with a backside of each of the plurality of driving chips facing toward the second adhesive layer, the at least one driver IC to be packaged oriented in a same direction;

filling gaps between the at least one optical module to be packaged, between the plurality of light-emitting units and between the LEDs with a plastic material and curing the plastic material to form a first plastic layer, the first plastic layer comprising a first layer and a second layer opposing the first layer, the first soldering layers and the second layer located on a same side of the optical module, the solder pads on the first soldering layers exposed at the second layer, filling gaps between the at least one driver IC to be packaged and between the plurality of driving chips with the plastic material and curing the plastic material to form a second plastic layer, the second plastic layer comprising a third layer and a fourth layer opposing the third layer, the second soldering layers and the third layer located on a same side of the driver IC;

removing the first and second support plates;

forming a plurality of through-holes in the second plastic layer, each through-hole penetrating through the second plastic layer along a thickness direction of the second plastic layer, filling the through-holes with a conductive material, forming a first structure on the third layer, the first structure first structure electrically connected to the driving chips via the solder pads on the second soldering layers and to the conductive material in the through-holes, and forming a second structure on the fourth layer, the second structure electrically connected to the conductive material in the through-holes;

bonding the optical module and the driver IC with the second layer facing toward the third layer, such that the bonded driving chips is able to independently turn on/off of the LEDs in at least one of the light-emitting units and independently electrically adjust brightness and color temperatures of the at least one of the light-emitting units; and separating the bonded optical and driver ICs so as to obtain as the display device.

Optionally, the first structure may comprise a first passivation layer, a first metal layer and a second passivation layer, the first metal layer comprising a plurality of first welding pads, the first metal layer configured to electrically connection of the solder pads in the driving chips of the driver IC and to electrically connect the conductive material in the through-holes, the second passivation layer covering the first metal layer with the plurality of first welding pads exposed at the second passivation layer, wherein a layer of the second passivation layer opposing the third layer and the fourth layer constitutes, together with the exposed first welding pads, a bonding layer of the driver IC.

Optionally, the second structure may comprise a third passivation layer, a second metal layer and a fourth passivation layer, the second metal layer comprising a plurality of second welding pads, the fourth passivation layer covering the second metal layer with the plurality of second welding pads exposed at the fourth passivation layer, the second metal layer electrically connected to the conductive material filled in the through-holes.

Compared to the prior art, in the display device and the packaging method of the present invention. The various constituent components of the optical module are fixed by the first plastic layer, and the various constituent components of the driver IC are fixed by the second plastic layer. Additionally, the circuits on the third layer are transferred onto the fourth layer by the first and second structures and by the conductive material filled in the through-holes in the second plastic layer. Further, the optical module is bonded to the driver IC, so that the optical module is electrically connected to the driving chips, and the driving chip can individually control the light-emitting units so as to electrically adjust their brightness and color temperatures as practically desired. This dispenses with the need for applying strict color temperature and brightness control during the selection of the LEDs, and space in the display device can be saved.

BRIEF DESCRIPTION OF THE DRAWINGS

The sole FIGURE is a schematic cross-sectional view of a display device according to an embodiment of the present invention.

LIST OF REFERENCE NUMERALS 100 optical module
110a light-emitting layer
110b first soldering layer
110 light-emitting unit
111, 112, 113 three light emitting diodes (LEDs)
120 first plastic layer
120a first layer
120b second layer
130 solder pads on first soldering layer
131 anode solder pad
132 cathode solder pad
200 driver IC
210 driving chip
210a second soldering layer
211 solder pads on second soldering layer
220 second plastic layer
220a third layer
220b fourth layer
221 through-hole
230 first structure
231 first passivation layer
232 first metal layer
2321 first welding pad
233 second passivation layer
230a bonding layer
240 second structure
241 third passivation layer
242 second metal layer
2421 second welding pad
243 fourth passivation layer

DETAILED DESCRIPTION

A specific embodiment of the present invention will be described in greater detail below with reference to the accompanying drawing. Features and advantages of the invention will be more readily apparent from the following detailed description and from the FIGURE. However, it is noted that the concept of the invention can be implemented in various forms and not limited to the specific embodiment disclosed herein. The FIGURE is provided in a very simplified form not necessarily presented to scale, with the only intention to facilitate convenience and clarity in explaining the embodiment.

It is noted that, for the sake of simplicity and clarity, the appended schematic cross-sectional view only shows two light-emitting units as an example.

The schematic cross-sectional view of FIG. 1 illustrates a display device according to the embodiment. As shown, the embodiment provides a display device. The display device includes an optical module 100 including a plurality of light-emitting units 110 (i.e., pixels). Each light-emitting unit includes at least three light-emitting diodes (LEDs) with different colors. The at least three light-emitting diodes are disposed apart from one another and adjacent two light-emitting units 110 are disposed apart from one another. Each of the order of the color arrangement and position of the at least three light-emitting diodes of each light-emitting unit 100 is the same.

In this embodiment, each of the light-emitting units 110 includes, for example, three LEDs 111, 112, 113 with different colors. The colors of the three LEDs 111, 112, 113 are red, green and blue respectively. The LEDs are, for example, gallium arsenide (AsGa) LEDs. The three LEDs 111,112,113 are disposed apart from one another and adjacent two light-emitting units 110 are disposed apart from one another. Each of the order of the color arrangement and position of the LEDs 111,112,113 of each light-emitting unit 100 is the same. For example, from left to right, the three LEDs with red light, blue light and green light are arranged in a line.

In other embodiments, each of the light-emitting units 110 may also include four LEDs with, for example, red, green, blue and white or a different set of colors. The colors may be selected based on practically requirements. Certainly, each of light-emitting units 110 may also include more than four LEDs with different colors.

Each of the LEDs has a light-emitting layer 110a and a backside (i.e., a first soldering layer 110b) opposing the light-emitting layer 110a. On the first soldering layers 110b of the LED are provided with solder pads 130. In particular, an anode solder pad 131 and a cathode solder pad 132 are provided on the first soldering layer 110b of the LED.

The optical module 100 further includes a first plastic layer 120 that fills the gaps between the plurality of light-emitting units 110 and between the LEDs so as to fix and electrically isolate the LEDs from one another. The first plastic layer 120 includes a first layer 120a and a second layer 120b opposing the first layer 120a. That is, the first plastic layer 120 includes a first layer 120a having a direction as same as a direction of the light-emitting layers 110a and a second layer 120b having a direction as same as a direction of the first soldering layers 130b. In other words, the light-emitting layers 110a and the first layer 120a are located on the same side of the optical module 100, while and first soldering layers 130b and the second layer 120b are located on the other side of the optical module 100. The light-emitting layers 110a are exposed at the first layer 120a, and the solder pads 130 on the first soldering layers 130b are exposed at the second layer 120b. That is, the second layer 120b exposes the anode solder pads 131 and the cathode solder pads 132 of the LED. The first plastic layer 120 has a thickness smaller than 0.5 mm. That is, a distance between the first layer 120a and the second layer 120b is smaller than 0.5 mm.

The display device further includes a driver IC 200 including a plurality of driving chips 210. Each driving chip 210 has a second soldering layer 210a and a backside opposing the second soldering layer 210a. The second soldering layers 210a of all the driving chips 210 are located on the same side of the driver IC 200, while the backsides of all the driving chips 210 are located on the other side of the driver IC 200. Solder pads are provided on the second soldering layers 210a of the driving chips 210. These driving chips 210 are disposed apart from one another. The driving chips 210 are configured to switch on or off the LEDs and electrically adjust their brightness levels and color temperatures.

The driver IC 200 further includes a second plastic layer 220 that fills the gaps between the plurality of the driving chips 210 so as to fix and electrically isolate the driving chips from one another. The second plastic layer 220 has a third layer 220a and a fourth layer 220b opposing the third layer 220a. The third layer 220a of the second plastic layer 220 has a direction as same as the direction of second soldering layers 210a, and the fourth layer 220b has a direction as same as the direction of the backsides opposing the second soldering layers 210a. In other words, the second soldering layers 210a and the third layer 220a are located on the same side of the driver IC 200, and the fourth layer 220b and the backsides of the driving chips 210 are located on the other side of driver IC 200. The solder pads 211 in the driving chips 210 are exposed at the third layer 220a. The second plastic layer 220 has a thickness smaller than 0.5 mm. That is, a distance between the third layer 220a and the fourth layer 220b is smaller than 0.5 mm.

The driver IC 200 further includes a plurality of through-holes 221 formed in the second plastic layer 220. Each of the through-holes 221 penetrates through the second plastic layer 220 along a thickness direction of the second plastic layer. The through-holes 221 are filled with a conductive material so as to electrically connect circuits on the third layer 220a to circuits on the fourth layer 220b. Specifically, the conductive material filled in the through-holes 221 accomplishes electrical connection of the solder pads 211 in the driving chips to the fourth layer 220b via the filled conductive material in the through-holes 221 so that the driving chips 210 in the driver IC are allowed to be selected from chips of different manufacturers or models with identical functions based on the practical needs, without having to integrate chips specially designed to address the need, thereby diversifying the chip source.

The conductive material is, for example, a conductive metal such as Cu (copper), W (tungsten), Ag (silver) or Au (gold), a conductive alloy or a conductive adhesive.

Provided on the third layer 220a is a first structure 230 electrically connected to the conductive material in the through-holes 221. The first structure 230 is electrically connected to the driving chips 210 via the solder pads 211 arranged on the second soldering layers 210a. The first structure 230 includes a first passivation layer 231, a first metal layer 232 and a second passivation layer 233. The first metal layer 232 includes a plurality of first welding pads 2321. The first passivation layer 231 covers the third layer 220a and the second soldering layers 210a. The first metal layer 232 is located on part of the first passivation layer 231, and the second passivation layer 233 covers both the first passivation layer 231 and the first metal layer 232. The first passivation layer 231 and second passivation layer 233 are configured for electrical isolation of the first metal layer 232 so as to immunize the first metal layer from any short circuit. The plurality of first welding pads 2321 are exposed from the second passivation layer 233. A layer of the second passivation layer 233 that faces away from the third layer 220a and the fourth layer 220b constitutes a bonding layer 230a of the driver IC 200, together with the exposed plurality of first welding pads 2321.

Preferably, each of the first and second passivation layers 231, 233 is an insulating material such as a polymer. For example, each of the first and second passivation layers is polyimide, benzocyclobutene (BCB), poly(p-phenylene benzobisoxazole) (PBO) or a combination thereof. The first and second passivation layers 231, 233 may be either formed by the same material or different materials.

In this embodiment, the first and second passivation layers 231, 233 are formed by the same material such as polyimide.

The first metal layer 232 may be an inorganic material such as Cu, Ag, W, Au or another metal, a conductive alloy or a conductive oxide (e.g., ITO), or a conductive organic material such as a conductive polymer. The first metal layer 232 has a thickness above the layer of the first passivation layer 231 of about 3-10 μm, preferably 3-5 μm.

The first passivation layer 231 may be provided with first and second connecting holes filled with a conductive material electrically. The conductive material filled in the first and second connecting holes has a first end connected to the first metal layer 232 and a second end connected to the conductive material in the through-holes 221 and to the solder pads 211 in the driving chips 210, thus an electrical connection of the driver IC 200 on the third layer 220a is achieved.

A second structure 240 is provided on the fourth layer 220b. The second structure 240 is electrically connected to the conductive material in the through-holes 221. The second structure 240 includes a third passivation layer 241, a second metal layer 242 and a fourth passivation layer 243. The second metal layer 242 includes a plurality of second welding pads 2421, and the third passivation layer 241 covers the fourth layer 220b. The second metal layer 242 is located on part of the third passivation layer 241, and the fourth passivation layer 243 covers both the third passivation layer 241 and the second metal layer 242. The third passivation layer 241 and the fourth passivation layer 243 are configured for electrical isolation of the second metal layer 242 so as to avoid a short in the second metal layer. The plurality of second welding pads 2421 are exposed from the fourth passivation layer 243. The plurality of second welding pads 2421 are connected the display device to other devices.

Preferably, each of the third and fourth passivation layers 241, 243 is an insulating material such as a polymer. For example, each of them is polyimide, benzocyclobutene (BCB), poly(p-phenylene benzobisoxazole) (PBO) or a combination thereof. It is possible that all of the first, second, third and fourth passivation layers 231, 233, 241 and 243 are made of the same material, or some of them are made of the same material, or each of them is made of a different material.

In this embodiment, the third and fourth passivation layers 241, 243 are formed by the same material such as polyimide.

The second metal layer 242 may be an inorganic material such as Cu, Ag, W, Au or another metal, a conductive alloy or a conductive oxide (e.g., ITO), or a conductive organic material such as a conductive polymer. The second metal layer 242 has a thickness above the layer of the third passivation layer 241 of about 3-10 μm, preferably 3-5 μm.

The third passivation layer 241 may be provided with third connecting holes filled with a conductive material. The conductive material of the third connecting hole has a first end electrically connected to the second metal layer 242 and a second end connected to the conductive material in the through-holes 221 such that electrical connection of circuits on the third layer 220a of the driver IC 200 to circuits on the fourth layer 220b is achieved, that is, an electrical connection of the driver IC 200 is achieved.

The optical module 100 is electrically connected to the driver IC 200 by bonding them together. The second layer 120b is orientated to the third layer 220a. Specifically, the solder pads 130 on the first soldering layers 110b of the optical module 100 are electrically connected to the first welding pads 2321 exposed at the bonding layer 230a of the driver IC 200 by bonding thereof. In other words, the solder pads 130 arranged on the first soldering layers are bonded and thereby electrically connected to the first welding pads 2321 exposed from the second passivation layer 233, so that subsequent to the bonding, each of the driving chips 210 in the driver IC 200 is able to control at least one of the light-emitting units 110. That is, the driving chip 210 can switch on/off at least three LEDs and electrically adjust their brightness and color temperatures. Further, each of the driving chips 210 can independently control at least one of the light-emitting unit 110. That is, the driving chip 210 can independently turn on/off the at least three LEDs in each light-emitting unit 110 and independently adjust brightness levels and color temperatures of the at least three LEDs in each light-emitting unit 110. The driving chips 210 can control and adjust currents following in the individual LEDs in the light-emitting units 110, thereby electrically adjusting the color temperatures and brightness of the light-emitting units 110 as practically desired. This dispenses with the need for applying strict color temperature and brightness control during the selection of the LEDs, ensuring the availability of sufficient sources of these components. The bonded optical module 100 and driver IC 200 have a total thickness that is smaller than or equal to 0.5 mm. That is, the display device has a thickness of smaller than or equal to 0.5 mm. Therefore, compared to the conventional display devices (e.g., LCDs), the display device allows space savings.

Preferably, in order lower a circuit complexity between the optical module 100 and the driver IC 200, the cathode solder pads 132 for some or all the LEDs in each of the light-emitting units 110 controlled by the driving chips 210 are electrically connected in parallel.

In this embodiment, each of the driving chips 210 independently turns on/off the three LEDs 111, 112, 113 in a corresponding one of the light-emitting units 110 and adjusts brightness and color temperatures of the three LEDs 111, 112, 113 in the light-emitting unit 110.

With continued reference to FIG. 1, in this embodiment, there is also provided a packaging method for a display device, which includes the following steps.

In step S1, providing a first support plate and a second support plate. A first adhesive layer is formed on one layer of first support plate and a second adhesive layer is formed on one layer of the second support plate. The first and second support plates has s shape of, for example, square or circle.

In step S2, placing at least one optical module 100 to be packaged on the first adhesive layer at an interval. The optical module 100 includes a plurality of light-emitting units 110. The adjacent two light-emitting units 110 are arranged apart from one another. Each of the light-emitting units 110 includes at least three LEDs 111,112,113 with different colors. For example, three LEDs 111, 112, 113 respectively emit, for example, red, green and blue light. The at least three LEDs are disposed apart from one another. Each of the LEDs has a light-emitting layer 110*a* and a first soldering layer 110*b*. The solder pads 130 are provided on the first soldering layer 110*b*. The first soldering layers 110*b* of the optical module 100 faces toward the first adhesive layer. Each of an arrangement and direction of the at least three LEDs with different colors in the plurality of light-emitting units 110 is the same. The at least one optical module 100 to be packaged is oriented identically. At least one driver IC 200 to be packaged is then placed on the second adhesive layer at an interval. The driver IC 200 includes a plurality of driving chips 210. Each driving chip 210 includes a second soldering layer 210*a* and a backside opposing the second soldering layer 210*a*. Solder pads 211 are provided on the second soldering layers 210*a*, and the driving chips 210 are arranged apart from one another. The backside of each driving chip 210 faces toward the second adhesive layer. The at least one driver IC 200 to be packaged is oriented in the same way.

In step S3, filling a plastic material in the gaps between the at least one optical module 100 to be packaged, between the plurality of light-emitting units 110 and between the LEDs therein. The plastic material is cured to form a first plastic layer 120. The first plastic layer has a first layer 120*a* and a second layer 120*b* opposing the first layer 120*a*. The first soldering layers 110*b* and the second layer 120*b* are located on the same side of the optical module 100, and the solder pads 130 on the first soldering layers 110*b* are exposed at the second layer 120*b*. A plastic material is then filled in the gaps between the at least one driver IC 200 to be packaged and between the plurality of driving chips 210. And the plastic material is cured to form a second plastic layer 220. The second plastic layer 220 has a third layer 220*a* and a fourth layer 220*b* opposing the third layer 220*a*. The second soldering layers 210*a* and the third layer 220*a* are located on the same side of the driver IC 200.

In step S4, removing the first and second support plates.

In step S5, a plurality of through-hole 221 are formed in the second plastic layer 220. The through-hole 221 penetrates through the second plastic layer 220 along a direction of thickness of the plastic layer 22. A conductive material is filled in the through-holes 221. The second plastic layer 220 has a third layer 220*a* and a fourth layer 220*b* opposing the third layer 220*a*. A first structure 230 is formed on the third layer 220*a*. The first structure 230 is electrically connected to the driving chips 210 through the solder pads 211 on the second soldering layers 210*a* and is also to the conductive material in the through-holes 221. The first structure 230 includes a first passivation layer 231, a first metal layer 232 and a second passivation layer 233. The first metal layer 232 includes a plurality of first welding pads 2321. The first metal layer 232 is configured to electrically connect with the solder pads 211 in the driving chips 210 of the driver IC 200 as well as with the conductive material filled in the through-holes 221. The second passivation layer 233 covers the first metal layer 232 with the plurality of first welding pads 2321 being exposed. A layer of the second passivation layer 233 that faces away from the third layer 220*a* and the fourth layer 220*b* constitutes a bonding layer 230*a* of the driver IC 200, together with the exposed plurality of first welding pads 2321. A second structure 240 is then formed on the fourth layer 220*b*. The second structure 240 is electrically connected to the conductive material in the through-holes 221. The second structure 240 includes a third passivation layer 241, a second metal layer 242 and a fourth passivation layer 243. The second metal layer 242 includes a plurality of second welding pads 2421. The fourth passivation layer 243 covers the second metal layer 242 with the plurality of second welding pads 2421 being exposed. The second metal layer 242 is electrically connected to the conductive material filled in the through-holes 221.

In step S6, bonding the optical module 100 and the driver IC 200 and hence an electrically connection is achieved between the optical module 100 and the driver IC 200. The second layer 120*b* faces toward the third layer 220*a*. Subsequent to the bonding, each driver IC 200 is configured to turn on/off the LEDs in at least one of the light-emitting units 110 and independently electrically adjusts their brightness and color temperatures of the LEDs of the at least one of the light-emitting units 110. The first soldering layers 110*b* in the optical module 100 face toward the bonding layer 230*a* of the driver IC 200.

In step S7, separating the bonded optical and driver ICs 100, 200 so as to obtain the display device.

In this embodiment, the optical module 100 and the driver IC 200 are formed simultaneously. However, in practice, the formation of the optical module 100 may precede the forming of the driver IC 200. Alternatively, the formation of the driver IC 200 may precede the forming of the optical module 100.

In summary, in the display device and the packaging method for the present invention, the various constituent components of the optical module are fixed by the first plastic layer and the various constituent components of the driver IC are fixed by the second plastic layer. Additionally, the circuits on the third layer are transferred onto the fourth layer by the first and second structures and by the conductive material filled in the through-holes in the second plastic layer. Further, the optical module is bonded and thus electrically connected to the driver IC, so that the driving chips can individually control the light-emitting units so as to electrically adjust their brightness and color temperatures as practically desired. This dispenses with the need for applying strict color temperature and brightness control during the selection of the LEDs, and space in the display device can be saved.

It is to be noted that, unless otherwise stated or indicated, the terms "first", "second", "third", "fourth" and the like are used herein to distinguish among various components, elements, steps, etc., without necessarily describing a particular logic or ordinal relationship among them.

It is to be understood that while the invention has been described above with reference to a preferred embodiment thereof, it is not limited to this disclosed embodiment. In light of the above teachings, any person familiar with the art may make various modifications and variations to the subject matter of the present invention or create equivalent embodiments based on equivalent changes without departing from the scope of the invention. Accordingly, any and all simple variations, equivalent changes and modifications made to the foregoing embodiments based on the substantive disclosure of the invention without departing from the scope thereof fall within the scope.

What is claimed is:

1. A display device, comprising:
    an optical module comprising a plurality of light-emitting units disposed apart from one another and a first plastic layer, each of the light-emitting units comprising at least three light-emitting diodes LEDs with different colors, the LEDs disposed apart from one another, each of the LEDs comprising a light-emitting layer and a first soldering layer, the first soldering layer provided with solder pads, the first plastic layer filling gaps between the plurality of light-emitting units and between the LEDs such that the LEDs and the light-emitting units are fixed together while electrically isolated, the first plastic layer comprising a first layer and a second layer opposing the first layer, the first soldering layers and the second layer located on a same side of the optical module, the solder pads provided on the first soldering layers exposed at the second layer; and
    a driver IC comprising a plurality of driving chips, a second plastic layer, a plurality of through-holes, a first structure and a second structure, each of the driving chips comprising a second soldering layer and a backside opposing the second soldering layer, the second soldering layer provided with solder pads, the driving chips disposed apart from one another, the second plastic layer filling gaps between the plurality of driving chips such that the driving chips are fixed together while electrically isolated, the second plastic layer comprising a third layer and a fourth layer opposing the third layer, the second soldering layers and the third layer located on a same side of the driver IC, the plurality of through-holes penetrating through the second plastic layer along a thickness direction of the second plastic layer, the through-holes filled with a conductive material, the first structure located on the third layer, the first structure electrically connected to the driving chips via the solder pads on the second soldering layers, the first structure electrically connected to the conductive material in the through-holes, the second structure arranged on the fourth layer, the second structure electrically connected to the conductive material in the through-holes,
    wherein the optical module is bonded to the driver IC, with the second layer facing toward the third layer, such that each bonded driving chip is able to independently control turn on/off of the LEDs in at least one of the light-emitting units and independently electrically adjust brightness and color temperatures of the LEDs in at least one of the light-emitting units.

2. The display device of claim 1, wherein the first structure comprises a first passivation layer, a first metal layer and a second passivation layer, the first metal layer comprising a plurality of first welding pads, the first passivation layer covering the third layer and the second soldering layers, the first metal layer located on a partial area of the first passivation layer, the second passivation layer covering the first passivation layer and the first metal layer, the first and second passivation layers configured to electrically isolate the first metal layer to prevent a short circuit in the first metal layer, the plurality of first welding pads exposed at the second passivation layer.

3. The display device of claim 2, wherein a layer of the second passivation layer opposing the third layer and the fourth layer constitutes, together with the exposed plurality of first welding pads, a bonding layer of the driver IC.

4. The display device of claim 3, wherein the solder pads on the first soldering layers are electrically connected to the first welding pads exposed at the bonding layer of the driver IC by bonding.

5. The display device of claim 2, wherein first and second connecting holes are provided in the first passivation layer, the first and second connecting holes filled with a conductive material, the conductive material filled in the first and second connecting holes having a first end electrically connected to the first metal layer and a second end electrically connected to the conductive material in the through-holes and to the solder pads arranged on the second soldering layers, thereby an electrical connection of the driver ICs on the third layer is achieved.

6. The display device of claim 1, wherein the second structure comprises a third passivation layer, a second metal layer and a fourth passivation layer, the second metal layer comprising a plurality of second welding pads, the third passivation layer covering the fourth layer, the second metal layer located on a partial area of the third passivation layer, the fourth passivation layer covering the third passivation layer and the second metal layer, the third and fourth passivation layers configured to electrically isolate the second metal layer to prevent a short circuit in the second metal layer, the plurality of second welding pads exposed at the fourth passivation layer.

7. The display device of claim 6, wherein the third passivation layer is provided with third connecting holes, the third connecting holes filled with a conductive material, the conductive material filled in the third connecting holes having a first end electrically connected to the second metal layer and a second end electrically connected to the conductive material filled in the through-holes, thereby circuits on the third layer of the driver IC are electrically connected to circuits on the fourth layer of the driver IC.

8. The display device of claim 1, wherein each of the light-emitting units comprises three LEDs, the three LEDs sequentially having colors of red, green and blue.

9. The display device of claim 8, wherein the LEDs include gallium arsenide LEDs.

10. The display device of claim 9, wherein each of the LEDs is provided with an anode solder pad and a cathode solder pad on the first soldering layer.

11. The display device of claim 1, having a thickness smaller than or equal to 0.5 mm.

12. The display device of claim 1, wherein each pixel corresponding to a light-emitting unit is configured for red, green and blue light emissions.

13. The display device of claim 12, wherein the driver IC is configured to control 4-8 pixels.

\* \* \* \* \*